United States Patent
Hoelscher

(10) Patent No.: US 10,031,197 B2
(45) Date of Patent: Jul. 24, 2018

(54) METHOD AND APPARATUS FOR ACQUIRING MAGNETIC RESONANCE SIGNALS OF AN EXAMINATION OBJECT

(71) Applicant: Siemens Healthcare GmbH, Erlangen (DE)

(72) Inventor: Uvo Hoelscher, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/365,211

(22) Filed: Nov. 30, 2016

(65) Prior Publication Data

US 2017/0153306 A1    Jun. 1, 2017

(30) Foreign Application Priority Data

Nov. 30, 2015    (DE) .......................... 10 2015 223 658

(51) Int. Cl.
*G01R 33/385* (2006.01)
*G01R 33/561* (2006.01)
*G01R 33/48* (2006.01)

(52) U.S. Cl.
CPC ..... *G01R 33/3852* (2013.01); *G01R 33/4828* (2013.01); *G01R 33/5617* (2013.01)

(58) Field of Classification Search
CPC ............ G01R 33/3852; G01R 33/4828; G01R 33/5617
See application file for complete search history.

(56) References Cited

U.S. PATENT DOCUMENTS

| | | | | |
|---|---|---|---|---|
| 4,714,884 A * | 12/1987 | Glover | ............. | G01R 33/56554 324/309 |
| 4,901,020 A * | 2/1990 | Ladebeck | .............. | G01R 33/50 324/307 |
| 4,920,314 A * | 4/1990 | Satoh | ................... | G01R 33/482 324/309 |
| 4,973,906 A * | 11/1990 | Bernstein | ............. | G01R 33/561 324/306 |
| 4,993,414 A * | 2/1991 | Macovski | ............ | G01R 33/563 324/306 |

(Continued)

OTHER PUBLICATIONS

Hargreaves, et al.: "Variable-Rate Selective Excitation for Rapid MRI Sequences"; Magnetic Resonance in Medicine, vol. 52, pp. 590-597; (2004).

(Continued)

*Primary Examiner* — Dixomara Vargas
(74) *Attorney, Agent, or Firm* — Schiff Hardin LLP

(57) ABSTRACT

In a method and magnetic resonance (MR) apparatus for acquiring MR signals of an examination object, an excitation pulse is radiated while a first gradient switching operation is activated, a refocusing pulse is radiated, a second gradient switching operation is activated with the second gradient switching operation having an opposite polarity to the first gradient switching operation. At least one of the first gradient switching operation and the second gradient switching operation has an amplitude modulation during radiation of the excitation pulse or the refocusing pulse. MR signals are acquired from nuclear spins in a body of the examination object that were excited by the excitation pulse and refocused by the refocusing pulse.

9 Claims, 2 Drawing Sheets

(56) References Cited

U.S. PATENT DOCUMENTS

| | | | | |
|---|---|---|---|---|
| 5,055,790 A * | 10/1991 | Siuciak | G01R 33/561 | 324/309 |
| 5,133,357 A * | 7/1992 | Dumoulin | A61B 5/0263 | 324/306 |
| 5,170,122 A * | 12/1992 | Bernstein | G01R 33/561 | 324/306 |
| 5,298,863 A * | 3/1994 | Nowak | G01R 33/3852 | 324/300 |
| 5,349,294 A * | 9/1994 | Kasuboski | G01R 33/446 | 324/309 |
| 5,416,412 A * | 5/1995 | Slayman | G01R 33/583 | 324/309 |
| 5,417,214 A * | 5/1995 | Roberts | G01R 33/56333 | 324/306 |
| 5,521,505 A * | 5/1996 | Kohno | G01R 33/5615 | 324/309 |
| 5,548,215 A * | 8/1996 | Kohno | G01R 33/5615 | 324/307 |
| 5,615,676 A * | 4/1997 | Kohno | G01R 33/5615 | 324/307 |
| 5,818,229 A * | 10/1998 | Kanazawa | G01R 33/56554 | 324/307 |
| 5,869,965 A * | 2/1999 | Du | G01R 33/56554 | 324/307 |
| 5,883,514 A * | 3/1999 | Ishikawa | G01R 33/5615 | 126/25 R |
| 5,899,858 A * | 5/1999 | Muthupillai | G01R 33/56358 | 324/307 |
| 5,923,168 A * | 7/1999 | Zhou | G01R 33/56581 | 324/307 |
| 6,064,205 A * | 5/2000 | Zhou | G01R 33/56554 | 324/307 |
| 6,078,176 A * | 6/2000 | McKinnon | G01R 33/56341 | 324/307 |
| 6,400,151 B1 * | 6/2002 | Haase | G01R 33/482 | 324/307 |
| 6,583,624 B1 * | 6/2003 | Muthupillai | G01R 33/56308 | 324/306 |
| 6,807,441 B2 * | 10/2004 | Schmainda | A61B 5/055 | 600/419 |
| 6,809,517 B2 * | 10/2004 | McGee | G01R 33/285 | 324/307 |
| 7,061,240 B2 * | 6/2006 | Ham | G01R 33/3854 | 324/309 |
| 7,259,558 B2 * | 8/2007 | Bieri | G01R 33/56358 | 324/306 |
| 7,567,832 B2 * | 7/2009 | Schmainda | A61K 49/06 | 324/306 |
| 7,706,857 B2 * | 4/2010 | Aletras | G01R 33/56308 | 324/306 |
| 8,299,789 B2 * | 10/2012 | Heid | A61B 5/055 | 324/309 |
| 8,405,395 B2 * | 3/2013 | Setsompop | G01R 33/4835 | 324/309 |
| 8,698,496 B2 * | 4/2014 | Sorensen | G01R 33/4633 | 324/307 |
| 8,847,594 B2 * | 9/2014 | Zhou | G01R 33/4833 | 324/307 |
| 9,081,075 B2 * | 7/2015 | Takizawa | A61B 5/055 | |
| 9,234,953 B2 * | 1/2016 | Labadie | G01R 33/4818 | |
| 9,435,871 B2 * | 9/2016 | Hirai | A61B 5/055 | |
| 9,453,897 B2 * | 9/2016 | Miyawaki | G01R 33/56518 | |
| 9,594,140 B2 * | 3/2017 | Hanada | A61B 5/055 | |
| 9,664,758 B2 * | 5/2017 | Stemmer | G01R 33/4818 | |
| 9,689,948 B2 * | 6/2017 | Ugurbil | G01R 33/5615 | |
| 9,778,338 B2 * | 10/2017 | Setsompop | G01R 33/543 | |
| 2002/0079891 A1 | 6/2002 | Blumich et al. | | |
| 2013/0249548 A1 | 9/2013 | Stemmer | | |

OTHER PUBLICATIONS

Lee et al., "Time-Efficient Slab-Selective Water Excitation for 3D MRI," Magnetic Resonance in Medicine, vol. 67, pp. 127-136 (2012).

* cited by examiner

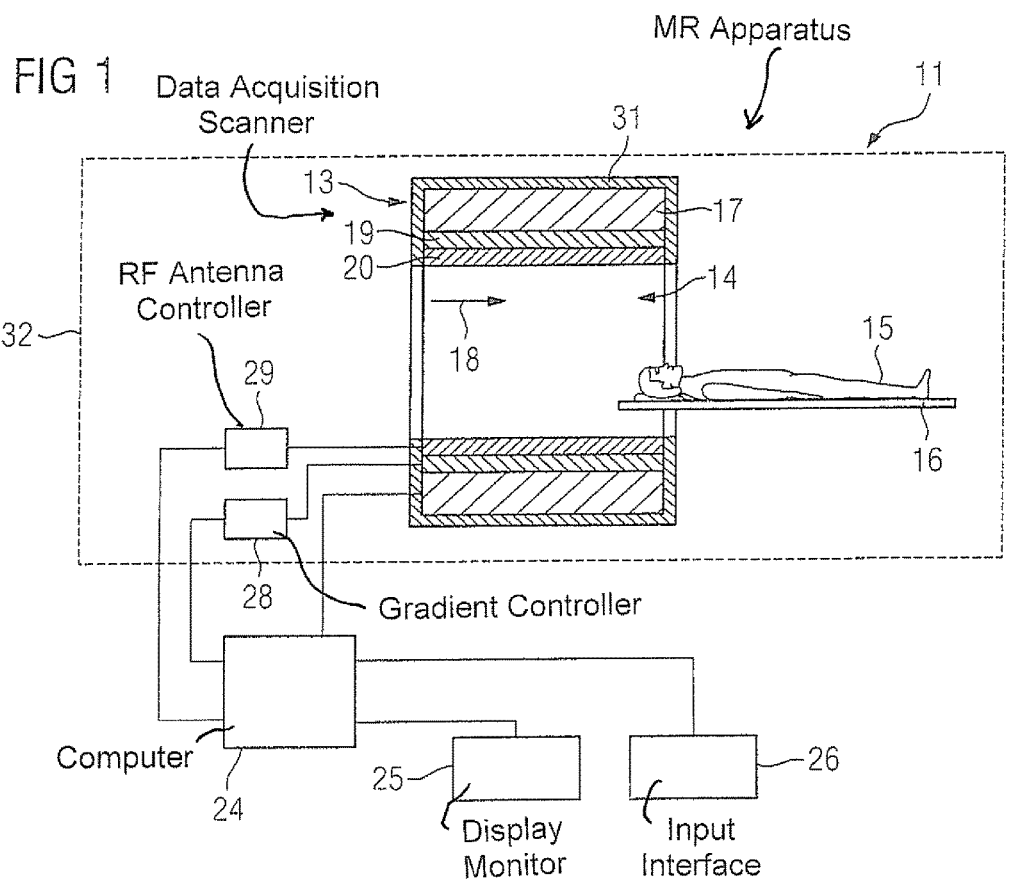

METHOD AND APPARATUS FOR ACQUIRING MAGNETIC RESONANCE SIGNALS OF AN EXAMINATION OBJECT

BACKGROUND OF THE INVENTION

Field of the Invention

The invention concerns a method for acquiring magnetic resonance signals of an examination object, as well as a magnetic resonance apparatus and a non-transitory data storage medium for implementing such a method.

Description of the Prior Art

In a magnetic resonance apparatus, also called a magnetic resonance tomography system, the body of an examination person, in particular a patient to be examined is conventionally exposed with a basic field magnet to a relatively high basic magnetic field, for example of 1.5 or 3 or 7 tesla. In addition, gradient switching operations are activated with the use of a gradient coil arrangement. Radio-frequency pulses, for example excitation pulses, are then emitted by a radio-frequency antenna unit by suitable antenna devices, and this leads to the nuclear spins of specific atoms excited in a resonant manner by these radio-frequency pulses being tilted by a defined flip angle with respect to the magnetic field lines of the basic magnetic field. As the nuclear spins relax, radio-frequency signals, known as magnetic resonance signals, are emitted that are received by suitable radio-frequency antennae, and then processed further. Finally, the desired image data can be reconstructed from the raw data acquired in this way.

For a specific scan, a specific magnetic resonance sequence, also called a pulse sequence, should be emitted that is composed of a sequence of radio-frequency pulses, for example excitation pulses and refocusing pulses, and appropriate gradient switching operations that are to be activated in a coordinated manner on various gradient axes in various directions. At a time appropriate therewith readout windows are set, and these specify the periods in which the induced magnetic resonance signals are detected.

SUMMARY OF THE INVENTION

An object of the invention is to enable improved magnetic resonance imaging.

The inventive method for acquiring magnetic resonance signals of an examination object by means of a magnetic resonance device has the following steps.

An excitation pulse is radiated and a first gradient switching operation is activated during the excitation pulse, A refocusing pulse is radiated, and a second gradient switching operation is activated during the refocusing pulse. The second gradient switching operation has an opposite polarity to the first gradient switching operation, and at least one of the first gradient switching operation and the second gradient switching operation has an amplitude modulation that occurs during the excitation pulse or the refocusing pulse.

Magnetic resonance signals are acquired from spins in the body of the examination object that are excited by the excitation pulse and refocused by the refocusing pulse.

The examination object can be a patient, a healthy test person, an animal or a phantom. Magnetic resonance image data can be reconstructed from the acquired magnetic resonance signals, and provided as an output in electronic form as a data file, which can be displayed for a user on a display monitor and/or stored in a database.

The excitation pulse, refocusing pulse, the first gradient switching operation and the second gradient switching operation are stored in a magnetic resonance sequence that is used for acquiring the magnetic resonance signals. As a temporal sequence, the refocusing pulse follows the excitation pulse, within a repetition time, so the refocusing pulse can refocus the spin excited by the excitation pulse. Acquiring the magnetic resonance signals then follows the refocusing pulse, also within the repetition time, so the magnetic resonance signals of spins excited by the excitation pulse and refocused by the refocusing pulse can be acquired. Acquiring the magnetic resonance signals involves data acquisition in a readout window, which means activating a receiving device for the magnetic resonance signals, for example an ADC (analog-digital converter), which is coupled to receiving coils of the magnetic resonance scanner. The acquired data are entered into a memory in which data entry points are organized so as to represent a domain known as k-space. One or more k-space row(s) of one or more slice(s) or a 3D volume of a magnetic resonance image is/are recorded during the data recording.

The excitation pulse cause a deflection of the magnetization of the nuclear spins in the body of the examination object. Excitation of the magnetization thus is caused by the excitation pulse in the body of the examination object, in particular in a scanning volume in the body of the examination object. The excitation pulse typically creates the condition for a magnetic resonance signal to be read. The amount of reflection of the magnetization of the resonant nuclear spins, relative to the field lines of the basic magnetic field, is called the flip angle. The excitation pulse can have i.e., producers, for example, a flip angle of 90°.

The refocusing pulse causes a refocusing of the excited spins in the body of the examination object, in particular in the scanning volume. Refocusing of the spins conventionally involves refocusing of dephased spins. The refocusing pulse can be designed for generating a spin echo of the spins excited by the excitation pulse. The refocusing pulse can have, for example, a flip angle of 180°. In specific applications a number of successive refocusing pulses can be used, during which a number of second gradient switching operations can be activated. The multiple second gradient switching operations can all have the opposite polarity to the first gradient switching operation. The multiple second gradient switching operations alternatively can have an alternating polarity, i.e. only some of the multiple second gradient switching operations have an opposite polarity to the first gradient switching operation. In the case of alternating polarity of the multiple second gradient switching operations, two successive second gradient switching operations of the multiple second gradient switching operations can that are opposite to each other. The multiple second gradient switching operations can also all have an amplitude modulation during radiation of the multiple refocusing pulses.

The first gradient switching operation and the second gradient switching operation are typically also called gradient pulses and are generated by a gradient coil arrangement of the magnetic resonance device. The first gradient switching operation and the second gradient switching operation are designed as slice selection gradient switching operations, which are designed for spatial encoding in the slice direction. The second gradient switching operation having an opposite polarity to the first gradient switching operation means that the second gradient switching operation has a negative polarity when the first gradient switching operation has a positive polarity, and vice versa. The value of the maximum amplitude of the first gradient switching operation and second gradient switching operation can be the same or different.

The activation of the first gradient switching operation during radiation of the excitation pulse means that the course over time of the first gradient switching operation at least partially, preferably largely, most preferably completely, overlaps the course over time of the excitation pulse. The first gradient switching operation and the excitation pulse can occur at the same time. A rising edge or a falling edge of the first gradient switching operation, which are respectively present at the beginning and end of the first gradient switching operation, occur before and after radiation of the excitation pulse. The rising edge and falling edges of the first gradient switching operation is therefore considered as temporally disjunct from the course over time of the excitation pulse.

The activation of the second gradient switching operation during radiation of the refocusing pulse means that a course over time of the second gradient switching operation at least partially, preferably largely, most preferably completely, overlaps the course over time of the refocusing pulse. The second gradient switching operation and the refocusing pulse can occur at the same time. A rising edge or a falling edge of the second gradient switching operation, which are respectively present at the beginning and end of the second gradient switching operation, occur before and after radiation of the refocusing pulse. The rising edge and falling edges of the second gradient switching operation thus are temporally disjunct from the course over time of the refocusing pulse. The course over time of the first gradient switching operation and a course over time of the second gradient switching operation are temporally disjunct from each other.

The at least one gradient switching operation having an amplitude modulation during radiation of the excitation pulse or refocusing pulse means that the at least one gradient switching operation changes in amplitude while the excitation pulse or refocusing pulse is radiated. The first gradient switching operation thus can have an amplitude modulation while the excitation pulse is radiated. Alternatively or additionally, the second gradient switching operation can have an amplitude modulation while the refocusing pulse is radiated. The amplitude modulation is to be regarded as a change in the amplitude of the at least one gradient switching operation in an effective range of the at least one gradient switching operation. The rising edge or a falling edge of the at least one gradient switching operation, which are present at the beginning and end of the at least one gradient switching operation, are not considered as such an amplitude modulation of the at least one gradient switching operation. Thus the change in amplitude that forms the amplitude modulation of the at least one gradient switching operation during the radiation of the excitation pulse or the refocusing pulse is a change in amplitude in addition to the rising edge or a falling edge of the at least one gradient switching operation, which are present at the beginning and end of the at least one gradient switching operation.

Activation of the second gradient switching operation with the opposite polarity to the first gradient switching operation, what is known as a gradient reversal, and can lead to an advantageous tissue saturation of specific tissue types in the acquired magnetic resonance signals. During acquisition of the magnetic resonance signals, the saturation typically causes a minimization or suppression of the magnetic resonance signals emitted from the specific tissue types. For example, the gradient reversal can lead to a fat saturation, which can be used to improve the contrast between fatty tissue and other tissue types. Alternatively, water saturation can be used to highlight fatty tissue.

The mechanism behind tissue saturation is an incomplete refocusing of the undesirable tissue signals, for example the fat signal, by the refocusing pulse due to the opposite polarities of the first gradient switching operation and second gradient switching operation. The undesirable tissue, hereinafter for example the fatty tissue, has a different Larmor frequency than the desired water tissue, typically due to the chemical shift, and this conventionally leads to a shift of water slices and fat slices. The different polarities of the first and second gradient switching operations, in particular the first and second slice selection gradient switching operations, can then lead to a shift of an excitation slice and a refocusing slice of the fatty tissue in the opposition direction to the water slice. A further factor here is that the frequency of the excitation pulse and the refocusing pulse is adjusted (set) to the water tissue, and not the fatty tissue. Since the excitation slice and refocusing slice of the fatty tissue then no longer completely overlap, only some of the excited fat signals are refocused and therefore fat signals are suppressed during acquisition of the magnetic resonance signals.

It has been found that the shift of the excitation slice and refocusing slice of the fatty tissue with respect to the water slice is inversely proportional to the amplitude of the first gradient switching operation or the second gradient switching operation. Higher gradient strengths lead to higher frequencies of the excitation pulse or refocusing pulse, so the severity of the shift of the excitation slice or refocusing slice of the fatty tissue is reduced. A suppression of the undesirable tissue signals, for example the fat signal, in the inventive method therefore works better, the lower an amplitude of the first gradient switching operation or the second gradient switching operation is.

A simple reduction in the amplitude of the first gradient switching operation or second gradient switching operation would lead, however, to the need for the simultaneously radiated excitation pulse or refocusing pulse to have a longer duration. This would lead to an increase in the echo time and therefore to a reduction in signal strength of the acquired magnetic resonance signals or image quality.

This drawback can be avoided by the inventive amplitude modulation of the first gradient switching operation or second gradient switching operation during radiation of the excitation pulse or refocusing pulse. The amplitude modulation can be designed such that there is a low gradient amplitude in a region critical for the saturation of the undesirable tissue signals, for example a central region, of the first gradient switching operation or second gradient switching operation. In contrast, there can be a higher gradient amplitude in other regions of the first gradient switching operation or second gradient switching operation.

The amplitude modulation of first gradient switching operation or second gradient switching operation thus can lead to a signification reduction in the overlapping of the excitation slice and refocusing slice of the undesirable tissue, so the duration of the excitation pulse or refocusing pulse can simultaneously be kept constant, or does not have to be significantly increased. Improved saturation of the undesirable tissue, for example of the fatty tissue, with the same duration of the excitation pulse or refocusing pulse can be achieved in this way by means of the inventive method. The inventive method thus achieves improved saturation of the undesirable tissue, for example of the fatty tissue, while retaining the image quality, for example by retaining the signal-to-noise ratio (SNR) of signals emitted by the desired tissue (water).

The inventive method can be used with spin echo sequences or turbo spin echo sequences. Application in the case of echo-planar imaging, in particular in the case of diffusion imaging, is also conceivable. Further applications of the method that appear expedient to those skilled in the art are also conceivable.

In an embodiment, the first gradient switching operation has an amplitude modulation during radiation of the excitation pulse and the second gradient switching operation has an amplitude modulation during playing of the refocusing pulse.

In this way, not just one gradient switching operation has the amplitude modulation during simultaneous radiation of the associated radio-frequency pulse, but both the first gradient switching operation and the second gradient switching operation have such an amplitude modulation. The desirable advantageous effect, namely the improvement in fat saturation while keeping the pulse duration constant, thus can be intensified.

Various embodiments of the amplitude modulation of the at least one gradient switching operation are described below. The described embodiments of the amplitude modulation can be used for the first gradient switching operation or for the second gradient switching operation. It is particularly advantageous for both gradient switching operations to use the described embodiments of amplitude modulation.

In one embodiment, the amplitude modulation of the at least one gradient switching operation is matched to a pulse characteristic of the simultaneously radiated excitation pulse or refocusing pulse.

The amplitude modulation of the first gradient switching operation can be matched to the pulse characteristic of the excitation pulse and/or the amplitude modulation of the second gradient switching operation to the pulse characteristic of the refocusing pulse. The amplitude of the at least one gradient switching operation can be chosen using a simultaneously present amplitude of the simultaneously radiated excitation pulse or refocusing pulse. Therefore there can be an especially low gradient amplitude of the simultaneously activated at least one gradient switching operation, particularly in a time span during which there is an especially radio-frequency amplitude of the excitation pulse or refocusing pulse. The desired effect of saturation of the undesirable tissue signals, while keeping the length of the excitation pulse or refocusing pulse constant, can be by matching the amplitude modulation of the at least one gradient switching operation to the pulse characteristic of the simultaneously radiated excitation pulse or refocusing pulse.

In another embodiment, the amplitude modulation of the at least one gradient switching operation is implemented in such that a value of an amplitude of the at least one gradient switching operation initially decreases during radiation of the excitation pulse or refocusing pulse and then increases again.

The reduction and subsequent increase in the amplitude of the at least one gradient switching operation occurs in addition to the rising edge or falling edge of the at least one gradient switching operation, which are present at the beginning and end of the at least one gradient switching operation. The amplitude of the at least one gradient switching operation is reduced before activating a central region of the at least one gradient switching operation and/or before radiation of a central region of the excitation pulse or refocusing pulse. After activating the central region of the at least one gradient switching operation and/or after radiating the central region of the excitation pulse or refocusing pulse, the amplitude of the at least one gradient switching operation can then be increased again. In this way the reduction and the increase in the amplitude of the at least one gradient switching operation occur while radiating the excitation pulse or radio-frequency pulse is still ongoing. In this way the at least one gradient switching operation, aside from the rising edge or falling edge thereof, can have a greater amplitude at the start and end of the at least one gradient switching operation than in a central region of the at least one gradient switching operation. This type of amplitude modulation of the at least one gradient switching operation can lead to intensifying of the desired effects in the present context.

In another embodiment, the amplitude modulation of the at least one gradient switching operation is implemented such that a value of an amplitude of the at least one gradient switching operation is lower in a temporal central region of the at least one gradient switching operation than in a temporal edge region of the at least one gradient switching operation.

The at least one gradient switching operation has two temporal edge regions. A first temporal edge region is at the beginning of the at least one gradient switching operation and a second temporal edge region is at the end of the at least one gradient switching operation. The first temporal edge region occurs immediately after the rising edge of the at least one gradient switching operation. The second temporal edge region occurs immediately before the falling edge of the at least one gradient switching operation. The temporal central region of the at least one gradient switching operation then exists between the first temporal edge region and the second temporal edge region.

The amplitude of the at least one gradient switching operation can be lower in the temporal central region than in the first temporal edge region and/or the second temporal edge region. The value of the amplitude of the at least one gradient switching operation is then lower, such as by at least 10 percent, preferably by at least 30 percent, most preferably by at least 50 percent, in the temporal central region than in the first temporal edge region and/or the second temporal edge region.

The amplitude characteristic of the at least one gradient switching operation can be matched to the pulse characteristic of the simultaneously radiated excitation pulse or refocusing pulse such that the temporal central region of the at least one gradient switching operation coincides with a temporal pulse central region of the simultaneously radiated excitation pulse or refocusing pulse. In the temporal pulse central region, the excitation pulse or refocusing pulse typically deposits the most radio-frequency output in the body of the examination object. The temporal central region of the at least one gradient switching operation can similarly coincide with a temporal pulse edge region of the simultaneously radiated excitation pulse or refocusing pulse. The purpose of the temporal central region of the excitation pulse can be excitation of the spins in the body of the examination object. Furthermore, the purpose of the temporal central region of the refocusing pulse can be to refocus the spins in the body of the examination object. Furthermore, the purpose of the temporal pulse edge region of the excitation pulse and refocusing pulse can be to define a form of the slice profile.

The lower amplitude of the at least one gradient switching operation, which is present during the temporal central region, thus can temporally coincide with the decisive temporal section of the simultaneously radiated excitation pulse or refocusing pulse. There is then advantageously a particularly low amplitude of the at least one gradient switching operation if the excitation pulse or refocusing pulse deposits a particularly high radio-frequency output in the body of the examination object. In this way the at least one gradient switching operation can be designed to enable strong suppression of the tissue signals, and the duration of the simultaneously radiated excitation pulse or refocusing pulse can advantageously be kept constant.

In another embodiment, the amplitude modulation of the at least one gradient switching operation is implemented such that there is a first value of the amplitude of the at least one gradient switching operation and a first radio-frequency voltage of the excitation pulse or refocusing pulse at a first point in time, a second value of the amplitude of the at least one gradient switching operation and a second radio-frequency voltage of the excitation pulse or refocusing pulse at a second point in time, with the first value of the amplitude being lower than the second value of the amplitude and the first radio-frequency voltage being higher than the second radio-frequency voltage.

The first point in time is in a temporal central region of the at least one gradient switching operation, and the second point in time is in a temporal edge region of the at least one gradient switching operation. The radio-frequency output deposited in the body of the examination object is proportional to the square of the radio-frequency voltage. In this way there is a lower amplitude of the at least one gradient switching operation when a higher radio-frequency output is deposited in the body of the examination object. Furthermore, the amplitude of the at least one gradient switching operation is then higher when a lower radio-frequency output is deposited in the body of the examination object. In the period in which the most radio-frequency output is deposited in the body of the examination object it is advantageous to set a low amplitude of the at least one gradient switching operation in order to further intensify the desired effect.

In another embodiment, the amplitude modulation of the at least one gradient switching operation is implemented such that there is a minimum value of the amplitude of the at least one gradient switching operation during a maximum radio-frequency voltage of the excitation pulse or refocusing pulse.

In this way the desired effect of slice separation between the excitation slice and refocusing slice of the undesirable tissue signal can be achieved particularly strongly.

In another embodiment, the excitation pulse and/or refocusing pulse is/are designed as a variable-rate selective excitation (VERSE) radio-frequency pulse.

VERSE pulses are known from the article by B. A. Hargreaves et al.: "Variable-Rate Selective Excitation for Rapid MRI Sequences", Magnetic Resonance in Medicine, 52:590-597 (2004). Due to their particular configuration VERSE pulses can enable a stronger shift of the excitation slice and refocusing slice of the undesirable tissue signal and therewith better saturation of the undesirable tissue signal than conventional radio-frequency pulses. At the same time VERSE pulses can have the same length as conventional radio-frequency pulses. In this way VERSE pulses enable improved saturation of the undesirable tissue signal with the same signal-to-noise ratio of the acquired magnetic resonance signals.

The inventive magnetic resonance apparatus has a scanner with a gradient coil arrangement and a radio-frequency antenna, and a computer configured to operate the scanner and its components to execute the inventive method.

The inventive magnetic resonance device thus is designed to implement the method for acquiring magnetic resonance signals of an examination object as described above. The radio-frequency antenna is operated to radiate an excitation pulse, with a first gradient switching operation being activated by the gradient coil arrangement during radiation of the excitation pulse. The radio-frequency antenna unit is also operated to radiate a refocusing pulse, with a second gradient switching operation being activated by the gradient coil arrangement during radiation of the refocusing pulse, with the second gradient switching operation having an opposite polarity to the first gradient switching operation and with at least one gradient switching operation of the first gradient switching operation and second gradient switching operation having an amplitude modulation during radiation of the excitation pulse or refocusing pulse. The scanner is designed to acquire magnetic resonance signals from nuclear spins in a body of the examination object that are excited by the excitation pulse and refocused by the refocusing pulse.

The present invention also encompasses a non-transitory, computer-readable data storage medium encoded with programming instructions (program code) that, when the storage medium is loaded into to a computer system of a magnetic resonance apparatus, cause the computer system to operate the magnetic resonance apparatus in accordance with any and all embodiments of the invention as described above, when the programming instructions are executed by the computer system.

Examples of electronically readable data media are a DVD, magnetic tape or a USB stick, on which electronically readable control information (code) is stored.

The advantages of the inventive magnetic resonance apparatus and the inventive data storage medium essentially correspond to the advantages of the inventive method, described above in detail. Features, advantages or alternative embodiments mentioned in this context are also applicable to the other aspects of the invention. The functional features of the method are performed by appropriate physical modules, in particular by hardware modules.

BRIEF DESCRIPTION OF THE DRAWINGS

FIG. 1 schematically depicts an inventive magnetic resonance apparatus.

FIG. 2 is a flowchart of a first embodiment of the inventive method.

DESCRIPTION OF THE PREFERRED EMBODIMENTS

Figure 3:
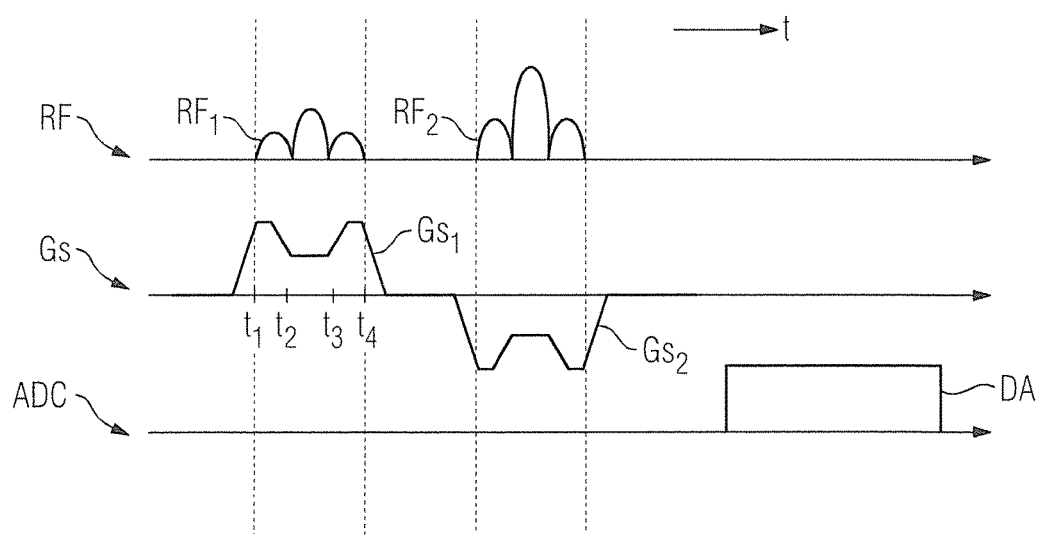
FIG. 3 is a schematic sequence diagram for carrying out an embodiment of the inventive method.

FIG. 1 schematically shows an inventive magnetic resonance apparatus 11. The magnetic resonance apparatus 11 has a data acquisition scanner 13, having a basic field magnet 17 that generates a strong and constant basic magnetic field 18. In addition, the magnetic resonance scanner 13 has a cylindrical patient-receiving region 14 for receiving an examination object 15, in the present case a patient. The patient-receiving region 14 is cylindrically surrounded in a circumferential direction by the scanner 13. The patient 15 can be moved by a patient-positioning device 16 of the scanner 13 into the patient-receiving region 14. The patient-positioning device 16 has an examination table that is movable inside the magnetic resonance scanner 13. The scanner 13 is shielded from the outside by a housing shell 31.

The scanner 13 also has a gradient coil arrangement 19 for generating magnetic field gradients that are used for spatial encoding during imaging. The gradient coil arrangement 19 is controlled by a gradient controller 28. The scanner 13 also has a radio-frequency antenna 20, which in the illustrated case is designed as a body coil permanently integrated in the scanner 13, and a radio-frequency antenna controller 29. The radio-frequency antenna 20 is controlled by the radio-frequency antenna controller 29 to radiate a radio-frequency magnetic resonance sequence into an examination volume that is essentially formed by the patient-receiving region 14. The radio-frequency sequence causes certain nuclear spins in the patient 15 to be deflected from the field lines of the basic magnetic field 18. As these excited nuclear spins relax, they emit radio-frequency magnetic resonance signals. The radio-frequency antenna 20 is also designed to receive the magnetic resonance signals from the patient 15.

For controlling the basic field magnet 17, the gradient controller 28 and the radio-frequency antenna controller 29, the magnetic resonance apparatus 11 has a computer 24. The computer 24 centrally controls the magnetic resonance apparatus 11, such as to carry out a predetermined imaging sequence such as a gradient echo sequence. Control information, such as imaging parameters, and reconstructed magnetic resonance images, can be supplied for a user on an output interface, in the present case a display monitor 25, of the magnetic resonance apparatus 11. Furthermore, the magnetic resonance apparatus 11 has an input interface 26, via which a user can enter information and/or parameters during a scanning process. The computer 24 can include the gradient controller 28 and/or radio-frequency antenna controller 29 and/or the display monitor 25 and/or the input interface 26.

The magnetic resonance apparatus 11 has a signal acquiring unit 32. In the present case the signal acquiring unit 32 is formed by the scanner 13 together with the radio-frequency antenna controller 29 and the gradient controller 28. The signal acquiring unit 32 can also have local radio-frequency antennae (not shown). The magnetic resonance scanner 13 with the gradient coil arrangement 19, radio-frequency antenna 20, and computer 24, are designed to carry out the inventive method for acquiring magnetic resonance signals.

The illustrated magnetic resonance apparatus 11 can have further components that magnetic resonance apparatuses conventionally have. The general mode of operation of a magnetic resonance apparatus 11 is known to those skilled in the art, so a detailed description of operation and the further components is not necessary herein.

FIG. 2 is a flowchart of a first embodiment of the inventive method for acquiring magnetic resonance signals of an examination object 15 by operation of the magnetic resonance apparatus 11.

In a first method step 40, an excitation pulse is radiated by the radio-frequency antenna 20, with a first gradient switching operation being activated by the gradient coil arrangement 19 during radiation of the excitation pulse.

In a further method step 41, a refocusing pulse is radiated by the radio-frequency antenna 20, with a second gradient switching operation being activated by the gradient coil arrangement 19 during radiation of the refocusing pulse, with the second gradient switching operation having an opposite polarity to the first gradient switching operation.

In the first method step 40 and/or second method step 41, at least one of the first gradient switching operation and the second gradient switching operation has an amplitude modulation during radiation of the excitation pulse or refocusing pulse.

In a further method step 42, magnetic resonance signals are acquired by the scanner 13 from spins in the body of the patient 15 that were excited by the excitation pulse and refocused by the refocusing pulse.

The method steps illustrated in FIG. 2 of the inventive method are carried out by the computer 24. For this purpose, the computer 24 has the requisite software and/or computer programs that are stored in a memory of the computer 24. The software and/or computer programs have program code that causes the inventive method to be implemented when the computer program and/or the software is/are executed in the computer 24.

FIG. 3 is a schematic sequence diagram of a magnetic resonance sequence, by which the inventive method according to one embodiment can be carried out. The schematic sequence diagram should be regarded only as one example of implementation of the inventive method. The schematic sequence diagram is shown only in an abstract manner and is highly simplified, since it shows only individual components of the magnetic resonance sequence. Therefore, for example, the illustrated radio-frequency pulses $RF_1$, $RF_2$ or the illustrated gradient switching operations $Gs_1$, $Gs_2$ can also have different forms from those shown in FIG. 3. For example, a rounded form is also conceivable for the gradient switching operations $Gs_1$, $Gs_2$. The distribution of the gradient switching operations $Gs_1$, $Gs_2$ among three plateaus is also just one possible embodiment of the gradient switching operations $Gs_1$, $Gs_2$. Furthermore, the sequence diagram shows just one recording (acquisition) cycle of the magnetic resonance sequence, which can occur, for example, during a repetition time.

In the sequence diagram shown in FIG. 3 the readout window DA, the radio-frequency pulses RF to be emitted, and the gradient switching operations in the slice selection direction are each conventionally illustrated as a function of time t on different time axes located one above the other. The amplitudes of the radio-frequency pulses $RF_1$, $RF_2$ to be emitted are shown on the top radio-frequency pulse time axis RF. The gradient switching operations $Gs_1$, $Gs_2$ in the slice selection direction are illustrated on the slice selection gradient axis Gs located therebelow. The zero line indicates the position of the respective slice selection gradient axis Gs, i.e. the gradient switching operations $Gs_1$, $Gs_2$ can have negative or positive polarities, depending on whether their amplitudes extend downwardly or upwardly from the slice selection gradient axis Gs. The readout window DA is illustrated on the bottom readout time axis ADC. Four points in time $t_1$, $t_2$, $t_3$, $t_4$, namely a first point in time $t_1$, a second point in time $t_2$, a third point in time $t_3$ and a fourth point in time $t_4$, are also marked on the time axis. For simplification, the scaling in the time direction and in the amplitude direction is only in arbitrary units in the sequence diagram.

In a first interval between the first point in time $t_1$ and the fourth point in time $t_4$ an excitation pulse $RF_1$ is emitted for exciting the nuclear spins in the body of the examination object 15. Meanwhile a first gradient switching operation $Gs_1$ is activated on the slice selection gradient axis Gs during the first interval, so the excitation pulse $RF_1$ acts slice selectively.

In a second interval a refocusing pulse $RF_2$ is emitted for refocusing the spins in the body of the examination object 15. Meanwhile a second gradient switching operation $Gs_2$ is activated on the slice selection gradient axis Gs during the second interval, so the refocusing pulse $RF_2$ acts slice selectively. As is evident from FIG. 3, the second gradient switching operation $Gs_2$ has an opposite polarity to the first gradient switching operation $Gs_1$. Of course, unlike as is shown in FIG. 3, the first gradient switching operation $Gs_1$ could also have a negative polarity and the second gradient switching operation $Gs_2$ a positive polarity.

Magnetic resonance signals are then read out during a readout window DA. The magnetic resonance signals that originate from spins from the body of the examination object 15 are acquired, and these have been excited by the excitation pulse $RF_1$ and refocused by means of the refocusing pulse $RF_2$.

During radiation of the excitation pulse $RF_1$ the first gradient switching operation $Gs_1$ has an amplitude modulation. The second gradient switching operation $Gs_2$ also has an amplitude modulation during radiation of the refocusing pulse $RF_2$. Of course it is also conceivable for just one of the gradient switching operations $Gs_1$, $Gs_2$ to have an amplitude modulation during radiation of the excitation pulse $RF_1$ or refocusing pulse $RF_2$. The amplitude modulation, i.e. the change in the amplitude of the gradient switching operation $Gs_1$, $Gs_2$ during the simultaneously radiated radio-frequency pulse $RF_1$, $RF_2$, is the same in terms of value for both gradient switching operations $Gs_1$, $Gs_2$ according to FIG. 3. Of course this is not imperative.

The amplitude modulation, illustrated in FIG. 3, for the first gradient switching operation Gs1 will be described in more detail below. This description applies analogously to the amplitude modulation of the second gradient switching operation $Gs_2$.

As is evident from FIG. 3, the first gradient switching operation $Gs_1$ has a first plateau, which begins with the first point in time $t_1$. The first gradient switching operation Gs1 has a second plateau, which begins with the second point in time $t_2$ and lasts until the third point in time $t_3$. The first gradient switching operation $Gs_1$ subsequently has a third plateau which lasts until the fourth point in time $t_4$. The gradient amplitude in the second plateau is lower than in the first plateau and in the third plateau. Before the first plateau or before the first point in time $t_1$ the first gradient switching operation $Gs_1$ has a rising edge which is concluded before the beginning of the excitation pulse $RF_1$. After the third plateau or after the fourth point in time $t_4$ the first gradient switching operation $Gs_1$ has a falling edge which begins after the end of the excitation pulse $RF_1$. In this way the rising and falling edges of the first gradient switching operation $Gs_1$ do not form part of the amplitude modulation of the first gradient switching operation $Gs_1$. It is therefore evident from FIG. 3 that the amplitude modulation of the first gradient switching operation $Gs_1$ is carried out such that a value of the amplitude of the first gradient switching operation $Gs_1$ initially decreases from the first plateau to the second plateau during the radiation of the excitation pulse $RF_1$ and then increases again from the second plateau to the third plateau.

According to FIG. 3 the amplitude modulation of the first gradient switching operation $Gs_1$ is carried out in such a way that a value of an amplitude of the first gradient switching operation $Gs_1$ in a temporal central region of the first gradient switching operation $Gs_1$, namely between the second point in time $t_2$ and the third point in time $t_3$, is lower than in a temporal edge region of the first gradient switching operation $Gs_1$, which is located, for example, between the first point in time $t_1$ and the second point in time $t_2$ or between the third point in time $t_3$ and the fourth point in time $t_4$.

The amplitude modulation of the first gradient switching operation $Gs_1$ according to FIG. 3 is matched to a pulse characteristic of the simultaneously radiated excitation pulse $RF_1$.

According to FIG. 3 the excitation pulse $RF_1$ is formed as a variable-rate selective excitation (VERSE) radio-frequency pulse.

The amplitude modulation of the first gradient switching operation $Gs_1$ is carried out in such a way that
   at a first point in time $t_1$ there is a first value of an amplitude of the at least one gradient switching operation and a first radio-frequency voltage of the excitation pulse $RF_1$,
   at a second point in time $t_2$ there is a second value of an amplitude of the at least one gradient switching operation $Gs_1$ and a second radio-frequency voltage of the excitation pulse $RF_1$, wherein
   the first value of the amplitude is lower than the second value of the amplitude and
   the first radio-frequency voltage is higher than the second radio-frequency voltage.

It is also evident from FIG. 3 that the minimum amplitude of the first gradient switching operation $Gs_1$ exists in the period between the second instant $t_2$ and the third instant $t_3$. The maximum radio-frequency voltage of the excitation pulse $RF_1$ is played during this instant.

Analogously, according to FIG. 3 the second gradient switching operation $Gs_2$ is also matched to the refocusing pulse $RF_2$.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:
1. A method for acquiring magnetic resonance signals from an examination subject, comprising:
   operating a magnetic resonance data acquisition scanner, comprising a radio-frequency (RF) emitter and a gradient coil arrangement, while an examination subject is situated in the scanner, to radiate an RF excitation pulse from said RF emitter while activating a first gradient switching operation with said gradient coil arrangement;
   operating said RF emitter to radiate an RE refocusing pulse while activating a second gradient switching operation with said gradient coil arrangement, with said second gradient switching operation having an opposite polarity to said first gradient switching operation, and with at least one of said first gradient switching operation and said second gradient switching operation having an amplitude modulation during radiation of the RF excitation pulse or the RF refocusing pulse said amplitude modulation of said at least one of said first and second gradient switching operations comprising making a value of an amplitude of said at least one of said first and second gradient switching operations to be lower in a temporal central region of said at least one of said first and second gradient switching operations than in a temporal edge region of said at least one of said first and second gradient switching operations; and
   operating the scanner to acquire magnetic resonance signals emitted by nuclear spins of said examination object that were excited by said RF excitation pulse and refocused by said RF refocusing pulse.

2. A method as claimed in claim 1 comprising activating said first gradient switching operation with said amplitude modulation during radiation of said Rf excitation pulse and activating said second gradient switching operation with said amplitude modulation during radiation of said RF refocusing pulse.

3. A method as claimed in claim 1 comprising operating said scanner to implement said amplitude modulation of said at least one of said first and second gradient switching operations by initially reducing an amplitude of said at least one of said first and second gradient switching operations and thereafter increasing said amplitude, during radiation of said RF excitation pulse or said RF refocusing pulse.

4. A method for acquiring magnetic resonance signals from an examination subject, comprising:
    operating a magnetic resonance data acquisition scanner, comprising a radio-frequency (RF) emitter and a gradient coil arrangement. while an examination subject is situated in the scanner, to radiate an RF excitation pulse from said RF emitter while activating a first gradient switching operation with said gradient coil arrangement;
    operating said RF emitter to radiate an RF refocusing pulse while activating a second gradient switching operation with said gradient coil arrangement, with said second gradient switching operation having an opposite polarity to said first gradient switching operation. and with at least one of said first gradient switching operation and said second gradient switching operation having an amplitude modulation during radiation of the RF excitation pulse or the RF refocusing pulse wherein, at a first point in time, said at least one of said first and second gradient switching operations is activated to have a first value of an amplitude thereof, and said RF excitation pulse or said RF refocusing pulse is radiated with a first radio-frequency voltage thereof and, at a second point in time, said at least one of said first and second gradient switching operations is activated with a second value of said amplitude thereof, and said RF excitation pulse or said RF refocusing pulse is radiated with a second radio-frequency voltage thereof, with said first value of said amplitude being lower than said second value of said amplitude and said first radio-frequency voltage being higher than said second radio-frequency voltage; and
    operating the scanner to acquire magnetic resonance signals emitted by nuclear spins of said examination object that were excited by said RF excitation pulse and refocused by said RF refocusing pulse.

5. A method as claimed in claim 1 comprising operating said scanner to implement said amplitude modulation of said at least one of said first and second gradient switching operations by causing an amplitude of said at least one of said first and second switching operations to have a maximum value during a maximum radio-frequency voltage of said RF excitation pulse or said RF refocusing pulse.

6. A method as claimed in claim 1 comprising radiating at least one of said RF excitation pulse and said RF refocusing pulse as a variable-rate selective excitation (VERSE) radio-frequency pulse.

7. A method as claimed in claim 4 comprising activating said first gradient switching operation with said amplitude modulation during radiation of said Rf excitation pulse and activating said second gradient switching operation with said amplitude modulation during radiation of said RF refocusing pulse.

8. A method as claimed in claim 4 comprising operating said scanner to implement said amplitude modulation of said at least one of said first and second gradient switching operations by initially reducing an amplitude of said at least one of said first and second gradient switching operations and thereafter increasing said amplitude, during radiation of said RF excitation pulse or said RF refocusing pulse.

9. A method as claimed in claim 4 comprising operating said scanner to implement said amplitude modulation of said at least one of said first and second gradient switching operations by causing an amplitude of said at least one of said first and second switching operations to have a maximum value during a maximum radio-frequency voltage of said RF excitation pulse or said RF refocusing pulse.

* * * * *